United States Patent
Lane et al.

(10) Patent No.: US 11,201,035 B2
(45) Date of Patent: Dec. 14, 2021

(54) RADICAL SOURCE WITH CONTAINED PLASMA

(71) Applicant: Tokyo Electron Limited, Tokyo (JP)

(72) Inventors: Barton Lane, Austin, TX (US); Peter Ventzek, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 240 days.

(21) Appl. No.: 15/971,778

(22) Filed: May 4, 2018

(65) Prior Publication Data
US 2019/0341226 A1  Nov. 7, 2019

(51) Int. Cl.
*H01J 37/32* (2006.01)
*H01L 21/67* (2006.01)

(52) U.S. Cl.
CPC ......... *H01J 37/3244* (2013.01); *H01J 37/321* (2013.01); *H01J 37/32091* (2013.01); *H01J 37/32201* (2013.01); *H01J 2237/327* (2013.01); *H01J 2237/3321* (2013.01); *H01J 2237/3323* (2013.01); *H01J 2237/3344* (2013.01); *H01L 21/67069* (2013.01)

(58) Field of Classification Search
None
See application file for complete search history.

(56) References Cited

U.S. PATENT DOCUMENTS

| | | | |
|---|---|---|---|
| 5,906,757 A | 5/1999 | Kong et al. | |
| 2001/0006093 A1* | 7/2001 | Tabuchi | C23C 16/458 |
| | | | 156/345.43 |
| 2006/0137608 A1 | 6/2006 | Choi et al. | |
| 2010/0033096 A1* | 2/2010 | Choi | H01J 37/32541 |
| | | | 315/111.21 |
| 2014/0159572 A1* | 6/2014 | Risby | H05H 1/30 |
| | | | 315/39.51 |
| 2016/0042920 A1 | 2/2016 | Cho et al. | |
| 2016/0097119 A1 | 4/2016 | Cui et al. | |

FOREIGN PATENT DOCUMENTS

| | | | | |
|---|---|---|---|---|
| JP | 2008-262781 A | * | 10/2008 | ............. C23C 16/54 |
| JP | 2008262781 | | 10/2008 | |

OTHER PUBLICATIONS

Korean Intellectual Property Office, The International Search Report and the Written Opinion for International application No. PCT/US2019/030201, dated Aug. 21, 2019, 10 pg.

* cited by examiner

*Primary Examiner* — Jethro M. Pence
(74) *Attorney, Agent, or Firm* — Oblon, McClelland, Maier & Neustadt, L.L.P.

(57) ABSTRACT

Described herein are technologies related to a radical source with a housing that includes a plasma cavity that is designed to contain a plasma created by a plasma generator. The housing has at least one gas injector designed to inject process gas into the plasma. The plasma produces radicals from the gas injected into the plasma. The cavity has an exit or opening formed therein that ejects the radicals from the cavity. The ejected radicals may be directed towards a subject wafer substrate under the radical source. This Abstract is submitted with the understanding that it will not be used to interpret or limit the scope or meaning of the claims.

14 Claims, 3 Drawing Sheets

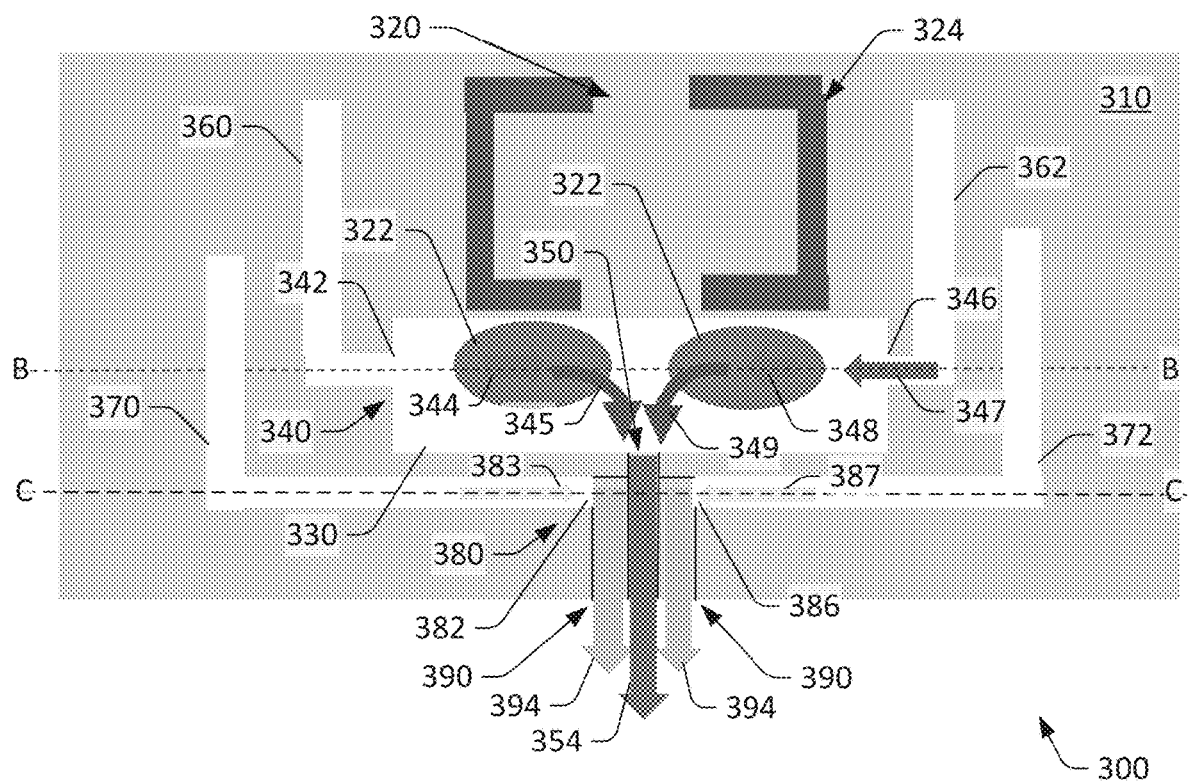
Fig. 3A
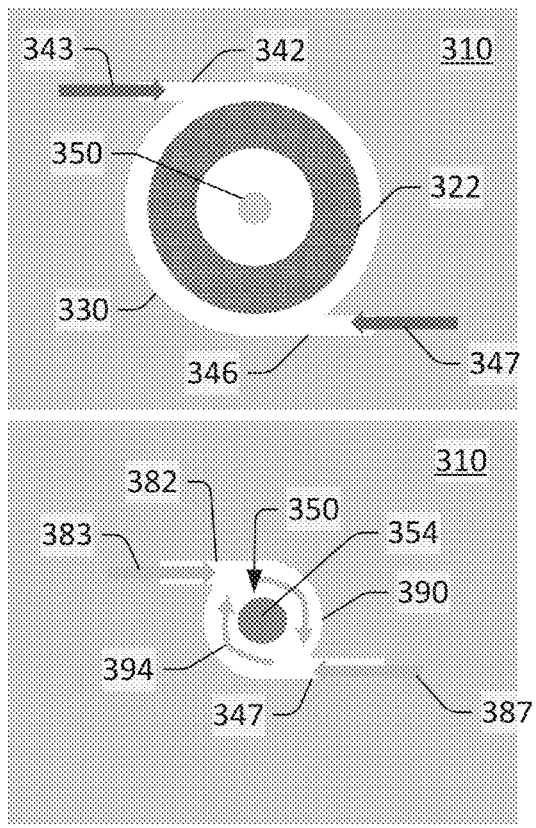
Fig. 3B
Fig. 3C

RADICAL SOURCE WITH CONTAINED PLASMA

BACKGROUND

An example of semiconductor wafer die fabrication processes include film etching processes during pattern transfer. Such processes may be subject to many problems affecting wafer die yield, productivity, reliability, and cost. Such problems can become more prevalent as patterns become smaller and tolerances become more constrained.

In plasma fabrication processes, issues can arise due to global plasma non-uniformity. For example, more plasma uniformity may be present towards the center of the wafer die than the edge. This may be due to the material/electrical discontinuity at the wafer edge. As an example, the region near the edge of the wafer die can have fluxes of radicals and charged species which differ strongly from fluxes of those species at the wafer die center. This may be because the edge of the wafer substrate marks a discontinuous electrical and material boundary.

BRIEF DESCRIPTION OF THE DRAWINGS

FIG. 3A shows a cross-section of another example radical source in accordance with the technology described herein.

FIG. 3B shows another cross-section of the example radical source of FIG. 3A.

FIG. 3C shows still another cross-section of the example radical source of FIG. 3A.

The Detailed Description references the accompanying figures. In the figures, the left-most digit(s) of a reference number identifies the figure in which the reference number first appears. The same numbers are used throughout the drawings to reference like features and components.

DETAILED DESCRIPTION

Disclosed herein is a technology related to plasma processing—such as etching and deposition—that emphasizes a flow of radicals to a surface of a semiconductor wafer during die fabrication. As used herein, examples of radicals include neutral species that are chemically reactive (e.g., an atom of oxygen or nitrogen), a molecular fragment with unsatisfied bonds (e.g., difluoromethane), and a metastable electronically or vibrationally excited species (e.g., singlet molecular oxygen).

During semiconductor die fabrication, it is often desirable to have a pure radical source with a low flux of charged species, such as ions or electrons. The technology described herein includes new hardware that generates a flux of radicals in a spatially and temporally controllable fashion as part of the plasma processing capable of use for high volume manufacturing of semiconductor devices.

The technology disclosed herein includes an example radical source with a housing that includes a plasma cavity that is designed to contain a plasma created by a plasma generator. The housing has at least one gas injector designed to inject process gas into the plasma in such a manner that facilitates a spin of the plasma in the cavity. This injection of the gas into the plasma produces a vortex of the plasma in the cavity. The plasma produces radicals from the gas injected into the plasma. The cavity has an exit or opening formed therein that ejects the radicals from the cavity. The ejected radicals may be directed towards a subject wafer substrate under the radical source.

Figure 1:
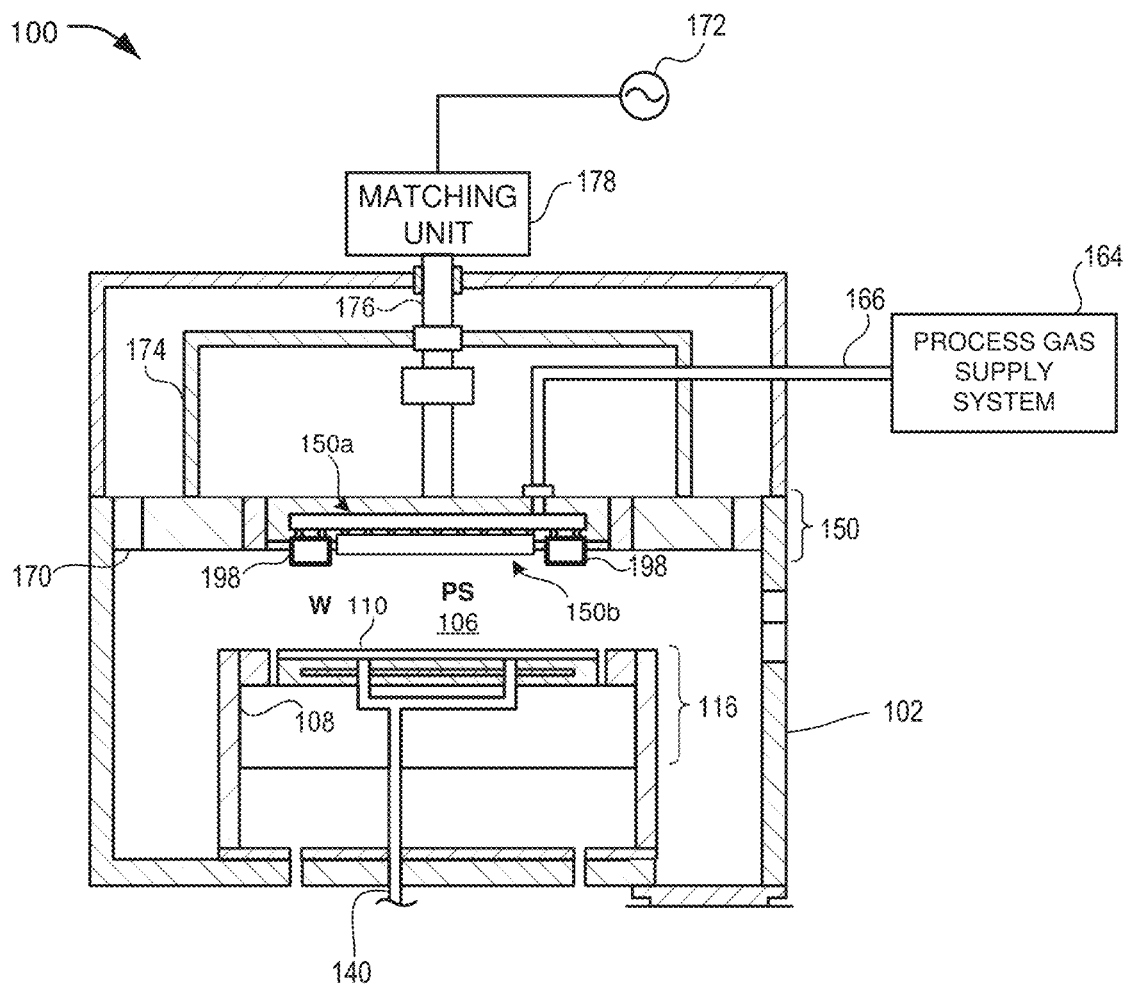
FIG. 1 shows a schematic cross-sectional view of an example of a plasma processing system 100 in accordance with the technology described herein.
Figure 1:
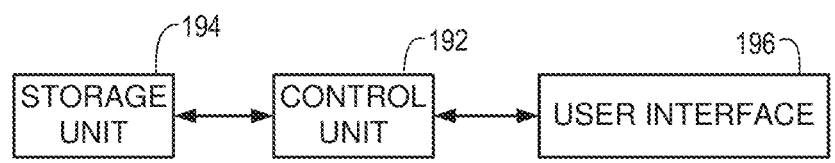

FIG. 1 shows a schematic cross-sectional view of an example of a plasma processing system 100 in accordance with the technology described herein. Depending upon the implementation, the plasma processing system 100 may be described as a capacitively coupled plasma (CCP) processing apparatus or a radial line slot antenna (RLSA) and inductively coupled plasma (ICP) processing system.

In particular implementations, the example plasma processing system 100 is used for semiconductor die fabrication processes. The example plasma processing system 100 includes both a primary or global plasma element 150 and auxiliary localized plasma elements 198. However, other variations may employ a distributed array of localized plasma elements covering a portion of or the entire area above a substrate (e.g., a semiconductor wafer).

Plasma elements are used for exciting and dissociating gases during a die fabrication process and creating radicals and ions. As used herein, a plasma element is an element capable of producing plasmas. An example of a plasma element includes electrodes exposed to the plasma, such as in a conventional capacitively coupled system. Another example of a plasma element includes metal structures outside the plasma region which either produce time-varying magnetic fields, such as with inductively coupled systems or propagating electromagnetic waves which enter the plasma region through a dielectric.

A plasma element can be singular or located above and below the wafer. In some instances, multiple plasma elements may form an array. A plasma element can produce plasma globally throughout the plasma region. In some instances, a plasma element may locally produce plasma a region proximate or local to that element.

A plasma element may produce a plasma in the main process chamber. In some instances, a plasma element may produce a mixture of plasma and radicals in a smaller auxiliary chamber which then flows into the main chamber. In some instances, a plasma element may produce a plasma in an auxiliary chamber which creates radicals that then flow into the main chamber. A plasma element beneath the wafer is usually a monolithic electrode which provides a sheath above the wafer which accelerates ions towards the wafer.

The example plasma processing system 100 may be used for multiple operations including ashing, etching, deposition, cleaning, plasma polymerization, plasma-enhanced chemical vapor deposition (PECVD), plasma-enhanced atomic layer deposition (PEALD) and so forth. Plasma processing can be executed within the processing chamber 102, which can be a vacuum chamber made of a metal such as aluminum or stainless steel.

The processing chamber 102 defines a processing vessel providing a process space (PS) 106 for operations such as ashing, etching, deposition, additive, cleaning, plasma polymerization, PECVD, PEALD and the like. For etching, the processing chamber 102 may be called an etching chamber. An inner wall of the processing chamber 102 can be coated with alumina, yttria, or another protectant. The processing chamber 102 can be cylindrical in shape or have other geometric configurations.

With conventional plasma processing with a primary plasma element, there may be an upper electrode assembly 150 or anode and a lower electrode assembly 116 or cathode positioned therein. The cathode is negatively biased with respect to the anode and the chamber walls. The upper electrode assembly consists of a plasma-facing plasma element 150b through which gas may be delivered from a plenum 150a, which is fed by a process gas supply system 164 through a tube 166. The upper electrode assembly also may contain plasma elements which produce a localized plasma 198; these may also produce a localized source of radicals as we will discuss.

In certain implementations, the plasma element which sustains the main plasma can be singular or there may be arrays of multiple elements, as described below. Such elements can be powered by high-frequency voltage.

This high-frequency voltage can be provided at the VHF band (30 MHz to 300 MHz), UHF band (300 MHz to 1 GHz), L band (1-2 GHz), S-band (2 GHz to 4 GHz), or the C band (4 GHz to 8 GHz) or the X band (8 GHz to 12 GHz). The high-frequency voltage for plasma elements can be provided through RF or microwave power (not shown) to the processing chamber 102.

A gas supply line 140, which passes through the susceptor 108, is configured to supply heat transfer gas to an upper surface of the susceptor. A heat transfer gas (also known as backside gas) such as helium (He) can be supplied to the substrate W 110 via the gas supply line 140 to assist in the heating substrate W 110.

Processing gas from a process gas supply system 164 supplies gas to the upper electrode assembly 150. The process gas supply system 164 can be configured to supply a processing gas for performing specific processes, such as film-forming, etching, and the like, on the substrate W 110. The process gas supply system 164 is connected to a gas supply line 166 forming a processing gas supply path. The gas supply line 166 supplies gas to the primary plasma element 150b and/or the localized plasma elements 198.

For localized plasma elements, separate gas outlet holes may be local to the localized plasma elements. In certain embodiments, the array is disposed around the region designed to receive the wafer.

Although controlled separately, the localized plasma elements are electrically connected with a high-frequency power source 172 (first high-frequency power source) via a power feeder 174, an upper power feed rod 176, and a matching unit 178.

The high-frequency power source 172 can output a high-frequency voltage having a frequency of 13 MHz (megahertz) or higher (e.g. 60 MHz), or can output a very high frequency (VHF) voltage having a frequency of 30-300 MHz. This power source 172 can be referred to as the main power supply as compared to a bias power supply. The power feeder 174 can be formed into, e.g., a substantially cylindrical shape having an open lower surface. The matching unit 178 is connected to the high-frequency power source 172 and can match load impedance with the internal impedance of the high-frequency power source 172.

Components of the example plasma processing system 100 can be connected to, and controlled by, a control unit 192, which in turn can be connected to a corresponding storage unit 194 and user interface 196. Various plasma processing operations can be executed via the user interface 196, and various plasma processing recipes and operations can be stored in storage unit 194.

Accordingly, a given substrate can be processed within the processing chamber with various microfabrication techniques. Plasma is generated that is used for processing a target substrate (such as substrate W 110 or any material to be processed) in various types of treatments such as plasma etching, chemical vapor deposition, treatment of glass material and treatment of large panels such as thin-film solar cells, other photovoltaic cells, and organic/inorganic plates for flat panel displays, etc.

The control unit 192 may include one or more processors, microcomputers, computing units and the like. The storage unit 194 may include memory and is an example of non-transitory computer-readable storage media for storing instructions which are executed by the control unit 192, to perform the various functions described herein. For example, the storage unit 194 may generally include both volatile memory and non-volatile memory (e.g., RAM, ROM, or the like).

The memory may be referred to as memory or computer-readable storage media herein. Memory is capable of storing computer-readable, processor-executable program instructions as computer program code that may be executed by the control unit 190 as a particular machine configured for carrying out the operations and functions described in the implementations herein.

The memory may further store one or more applications (not shown). The applications may include preconfigured/installed and downloadable applications.

In certain implementations, an array of localized (or even ultra-localized) plasma elements 198 are employed. Such localized plasma elements 198 can be placed towards the edge of substrate W 110. In particular, localized plasma sources 198 or an array of such structures is located at an edge of a wafer die platform of the plasma processing system 100. For example, localized plasma sources 198 or an array of such structures can influence the extreme edge of the plasma by locating such localized plasma sources 198 in a narrow gap reactor above the wafer W 110 edge. In certain implementations, radially radiating linear or circumferential arrays of plasma sources 198 can be used to produce a spatially controllable plasma over entire wafer W 110.

Figure 2A:
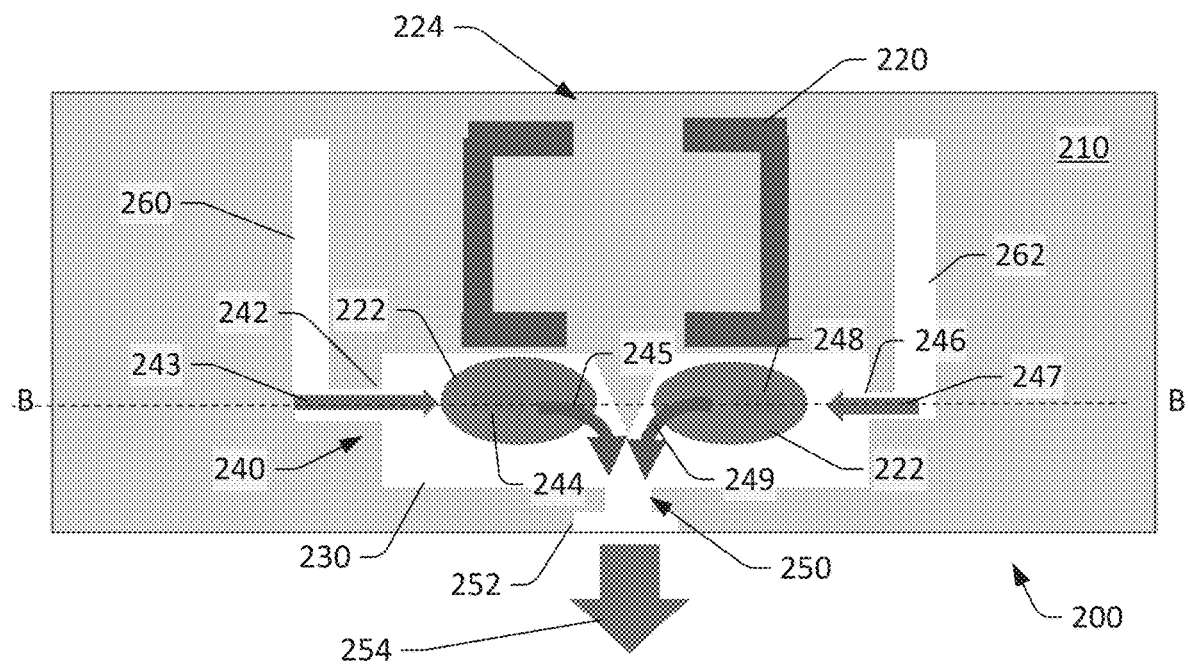
FIG. 2A shows a cross-section of an example radical source in accordance with the technology described herein.
Figure 2B:
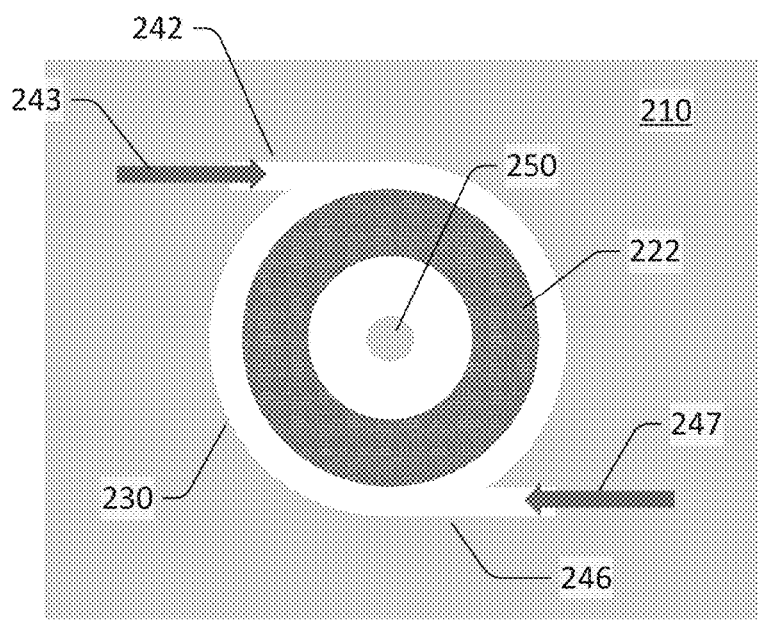
FIG. 2B shows another cross-section of the example radical source of FIG. 2A.

FIG. 2A shows a cross-section of an example radical source 200. FIG. 2B shows another cross-section of the example radical source 200. The cross-section of FIG. 2B is along line B-B as shown in FIG. 2A.

One or more of the localized plasma elements 198 shown in FIG. 1 may be the example radical source 200. Chemically, radicals are, for example, a neutral species that are chemically reactive, a molecular fragment with unsatisfied bonds, or a metastable electronically or vibrationally excited species.

As depicted in FIGS. 2A and 2B, the example radical source 200 include a housing 210, a plasma generator 220, a plasma cavity 230, a gas injector 240, a cavity exit or opening 250, and a nozzle 252.

The housing 210 is a block of heat-resistant and chemical-reaction resistant material. Examples of such non-reactive material include ceramics, such as alumina and yttria. The housing 210 has a plasma cavity 230 formed therein to contain a plasma 222. The neutral pressure in the plasma cavity 230 will be greater than the neutral pressure in the main process chamber so that gas will flow from the plasma cavity 230 into the main chamber. The pressure in the plasma cavity 230 can extend from 150 mtorr to 50 torr.

The plasma generator 220 is embedded in the housing 210. As its name implies, the plasma generator generates the plasma 222. And it generates the plasma 222 inside the plasma cavity 230. The plasma generator 220 includes a resonant element 224 that is driven by, for example, radio-frequency (RF), microwave power, or current source to generate the plasma 222.

As depicted, the resonant element 224 has a quadrupole symmetry. The resonant element 224 has capacitive components and their corresponding inductive components, which form an LC circuit. In such a resonant circuit, the stored energy is exchanged between the capacitors and the inductors at the resonant frequency.

The changing magnetic fields which extend from the resonant element into the plasma cavity by Faraday's law induce a changing electric field and this changing electric field couples power to electrons in the plasma and thereby enables the plasma to be created and sustained. The geometric size of the resonant structures may be equal or considerably smaller than the free space wavelength of the electromagnetic radiation at the resonant frequency.

The use of a resonant element allows the plasma contained in the cavity to be compact. In some implementations, the radical sources may be arranged in an array above the wafer in the top electrode. The internal plasma regions can be individually controlled in order to provide spatial control of the radical flux. This control can either be accomplished by selecting the frequency components of the exciting microwave power to selectively resonate with certain members of the array or in the "phased array" configuration individual low power microwave generators would power each source individually.

The gas injector 240 injects process gas into the plasma 222 in the cavity 230. The gas injector 240 may have multiple injection ports. As depicted, the gas injector 240 has two ports (port 242 and port 246). The process gas arrives at port 242 via gas passage 260. The process gas arrives at port 246 via gas passage 262.

Port 242 injects process gas 243 into the plasma 222 so that the plasma disassociates the injected gas 244 to produce radicals 245. Similarly, port 246 injects process gas 247 into the plasma 222 so that the plasma produces radicals 249 from the injected gas 248. In this way, the gas injector 240 injects the gas so that all injected gas passes through the plasma 222. This leads to a high efficiency of radical production.

The gas passes in a helical path starting at the outside of the cavity and circling into towards the central exit aperture (e.g., cavity exit or opening 250). Since the plasma is ring-shaped due to the geometry of the resonant elements such a path allows the maximum residence time for the gas and ensures that the great majority of the gas has the same residence time in the plasma thereby achieving greater efficiency in producing radicals and narrowing the variety of species that are produced.

As depicted, the plasma cavity 230 is cylindrical in shape. The ports (e.g., ports 242 and ports 246) are arranged at the edge of the cylindrically shaped cavity 230 with a tangential orientation thereto. In this way, the gas is injected into the plasma contained in the cavity and thereby induces a spin of the plasma in that cavity. That spin forms a vortex of the plasma. That is, the spin forms a plasma vortex.

The gas is injected at the edge of the cavity with a tangential orientation and leaves the cavity through a narrow circular opening in the center. Combined with an expanded region below the narrow exit opening, this geometry leads to a converging-diverging de Laval nozzle and hence provides supersonic flow at the exit of the diverging region. Radical flow 254 represents the radicals ejecting at a supersonic flow. It is desirable to have rapid and directed flow out of the radical source in order to efficiently transport radicals to the wafer surface.

The cavity exit or opening 250 is located at bottom or base of the cylindrically shaped cavity 230 and in the coaxial center of that cavity. A nozzle 252 is attached to the cavity exit 250. The nozzle 252 may be a converging-diverging nozzle. The nozzle 252 may be a de Laval nozzle.

When the gas is injected into the plasma, ions are created. However, those ions recombine before being ejected from the nozzle. The plasma 222 that is created by the resonant element 220 consists of electrons and ions which are charged particles. These particles are created by the electric fields from the resonant element which heat electrons until they have sufficient energy to ionize the injected neutral gas, and they are destroyed by either volumetric recombination of ions and electrons or by neutralization on the walls of the plasma cavity 230. Ions striking a material wall will neutralize with unit probability. Because the ions have a higher random velocity than the neutral particles, they diffuse quickly to the cavity walls where they neutralize. This is particularly true in the nozzle region 250 where the emerging mixture of neutrals, ions, and electrons passes closest to the material surface walls.

The example radical source 200 is positioned over a region configured to hold a wafer so that the radicals are ejected towards a wafer when that wafer is on that region (as indicated by radical flow 254).

FIG. 3A shows a cross-section of another example radical source 300. FIG. 3B shows a cross-section of the example radical source 300. The cross-section of FIG. 3B is along line B-B as shown in FIG. 3A. FIG. 3C shows another cross-section of the example radical source 300. The cross-section of FIG. 3C is along line C-C as shown in FIG. 3A.

One or more of the localized plasma elements 198 shown in FIG. 1 may be the example radical source 300. The example radical source 300 is similar to example radical source 200 except that example radical source 300 introduces an additional feature to focus and direct the radicals being ejected from the example radical source.

As depicted in FIGS. 3A, 3B, and 3C, the example radical source 300 include a housing 310, a plasma generator 320, a plasma cavity 330, a gas injector 340, a cavity exit or opening 350, and a gas-curtain jet 380.

The housing 310 is a block of heat-resistant and chemical-reaction resistant material. The housing 310 has a plasma cavity 330 formed therein to contain a plasma 322 therein under pressure.

As depicted, the plasma cavity 330 is cylindrical in shape. The plasma cavity 330 has an exit or opening 350 that is located at bottom or base of the cylindrically shaped cavity 330 and in the coaxial center of that cavity. The housing 310 forms a cylindrical axisymmetric gas-curtain opening 390 around the exit 350. In some instances, the exit 350 may form a tube at least partially through the gas-curtain opening 390.

The plasma generator 320 is embedded in the housing 310. As its name implies, the plasma generator generates the plasma 322. The use of a resonant element allows the plasma contained in the cavity to be compact. In some implementations, the radical sources may be arranged in an array above the wafer in the top electrode.

The gas injector 340 injects process gas into the plasma 322 in the cavity 330. The gas injector 340 may have multiple injection ports. As depicted, the gas injector 340 has two ports (port 342 and port 346). The process gas arrives at port 342 via gas passage 360. The process gas arrives at port 346 via gas passage 362.

Port 342 injects process gas (not shown) into the plasma 322 so that the plasma disassociates the injected gas 344 to produce radicals 345. Similarly, port 346 injects process gas 347 into the plasma 322 so that the plasma produces radicals 349 from the injected gas 348. In this way, the gas injector 340 injects the gas so that all injected gas passes through the plasma 322. This leads to high efficiency of radical production.

The gas is injected at the edge of the cavity with a tangential orientation and leaves the cavity through a narrow circular opening 350 in the center. Combined with an expanded region below the narrow exit opening, this geometry leads to a converging-diverging de Laval nozzle and hence provides supersonic flow at the exit of the diverging region. Radical flow 354 represents the radicals ejecting at a supersonic flow.

The example radical source 300 is positioned over a region configured to hold a wafer so that the radicals are ejected towards a wafer when that wafer is on that region (as indicated by radical flow 354).

As it is ejected from the narrow circular opening 350, the radical flow 354 is a narrow column or stream. However, as the radical flow 354 travels away from the opening 350 (e.g., downward), the stream has a tendency to widen or diverge. In so doing, the radicals of the flow 354 are spread out over a larger area as they encounter the wafer below.

In some instances, it is undesirable for the radicals of the flow 354 to hit the wafer in a wider area. That is, it is desirable for the radical flow 354 to be more focused. For example, this is particularly helpful at the edge of a wafer.

The gas-curtain jet 380 is included in the example radical source 300 to encourage the focus of the radical flow 354. That is, the gas-curtain jet 380 discourages the divergence of the radical flow 354 after it exits the opening 350. The gas-curtain jet 380 shoots a circular curtain of gas 394 from the example radical source 300. The circular curtain of gas is axisymmetric about and concentric to the radical flow 354 that ejects from the opening 350.

The example radical source 300 incorporates a second gas to form a gas curtain. The gas-curtain jet 380 injects the second gas below the narrowest opening (e.g., exit 350) of for the first gas. This second gas is injected into a vortex geometry in order to produce an axisymmetric gas curtain.

The local pressure of the curtain gas at the point of injection is higher than the local pressure of the main injected radical plume at this point although the total of the pressure and kinetic energy of the radical plume is larger than the local pressure of the gas curtain. This ensures that the curtain gas does not choke the radical plume while the higher pressure of the curtain gas leads to a radial compression of the injected gas plume creating a narrow jet which impinges on the wafer with a small footprint.

FIG. 3C, in particular, shows a cross-section of the gas-curtain jet 380. The gas-curtain opening 390 is cylindrical cavity and opening that is substantially asymmetrically aligned with or around the exit 350. In some instances, the exit 350 may form a tube at least partially through the volume formed by the gas-curtain opening 390.

The gas shot by the gas-curtain jet 380 is chemically different from the gas injected into the plasma 222 by the injector 340. The gas-curtain jet 380 pulls inert gas from a supply of such gas. Being inert, the gas is not intended to interact (e.g., chemically or otherwise) with the plasma, substrate, radicals, or otherwise.

Port 382 injects inert gas 383 into the gas-curtain opening 390. Similarly, port 386 injects process gas 387 into the gas-curtain opening 390. Gas supply lines 370 and 372 supply the inert gas to port 382 and 386, respectively.

The inert gas is injected at the edge of the gas-curtain opening 390 with a tangential orientation and leaves the gas-curtain opening 390 through the bottom and in a circle that asymmetrically surrounds the exit 350. Radical flow 354 represents the radicals ejecting as a supersonic flow from the exit 350, and gas-curtain flow 394 represents the spinning hollow column of inert gas surrounding the ejected radicals.

What is claimed is:

1. A radical source comprising:
   a plasma generator to generate a plasma;
   a housing that includes the plasma generator and a plasma cavity to contain the generated plasma therein, the plasma generator being positioned in the housing above the plasma cavity;
   a gas injector to inject gas into the plasma cavity at a position below the plasma generator, the gas injector including: (i) a first gas passage and a second gas passage, and (ii) a first port and a second port located on opposite sides of the plasma cavity, the first port and second port being connected to the first and the second gas passages, respectively, wherein the plasma produces radicals from the gas; and
   a nozzle attached to or formed in the housing, the nozzle provides an exit in the plasma cavity to eject the radicals therefrom.

2. The radical source as recited in claim 1, wherein the gas injected into the plasma cavity by the gas injector to inject gas into the plasma facilitates a spin of a vortex of the plasma around a coaxial axis of the plasma cavity.

3. The radical source as recited in claim 1, wherein the plasma generator includes a resonant element that is driven by radio-frequency (RF), microwave power, or current source to generate the plasma.

4. The radical source as recited in claim 1, wherein the nozzle includes a converging-diverging de Laval nozzle.

5. The radical source as recited in claim 1, wherein the plasma cavity is cylindrical, the first port of the gas injector injects the gas at an edge of the plasma cavity with a tangential orientation thereto, the second port of the gas injector injects the gas at the edge of the plasma cavity with the tangential orientation thereto, and the exit in the plasma cavity is positioned in a coaxial center of the plasma cavity.

6. The radical source as recited in claim 1, wherein the radicals eject from the nozzle at a supersonic speed.

7. The radical source as recited in claim 1 further comprising a gas-curtain jet to shoot a circular curtain of gas from the radical source, wherein the circular curtain of gas is axisymmetric to the radicals that eject from the nozzle.

8. The radical source as recited in claim 7, wherein the gas shot by the gas-curtain jet is chemically different from the gas injected into the plasma.

9. The radical source as recited in claim 1, wherein the radical source is embedded in a heat-resistant and chemical-resistant material selected from a group comprising ceramic, alumina, or yttria.

10. A plasma processing system comprising an array of radical sources as recited in claim 1 and positioned over a region configured to hold a wafer so that the radicals are ejected towards the region.

11. The radical source of claim 1, wherein the nozzle is connected to the plasma cavity via a coaxial center of the plasma cavity.

12. A radical source comprising:
   a housing that includes a plasma cavity to contain a plasma generated by a plasma generator;
   a gas injector to inject gas into the plasma cavity such that the gas injected into the plasma cavity by the gas injector facilitates a spin of a vortex of the plasma around a coaxial axis of the plasma cavity; and an exit nozzle formed therein to eject the gas from the cavity.

13. A radical source as recited in claim 12, wherein the cavity is cylindrical, the gas injector injects gas at an edge of the cylindrical cavity with a tangential orientation thereto, and the exit in the cavity is positioned in a coaxial center of the cylindrical cavity.

14. A plasma processing system comprising:
- an array of multiple radical sources that are positioned over a wafer holder so that radicals from the radical sources are ejected towards the region;
- wherein each radical source includes:
    - a housing that includes a plasma cavity to contain the generated plasma under pressure;
    - a gas injector to inject gas into the plasma cavity such that the gas injected into the plasma cavity by the gas injector facilitates a spin of a vortex of the plasma around a coaxial axis of the plasma cavity, wherein the plasma produces radicals from the gas; and
    - a nozzle about the exit to facilitate acceleration of the radicals upon ejection from the cavity.

* * * * *